(12) United States Patent
Wan et al.

(10) Patent No.: US 11,444,003 B2
(45) Date of Patent: Sep. 13, 2022

(54) INTEGRATED HEAT SPREADER WITH MULTIPLE CHANNELS FOR MULTICHIP PACKAGES

(71) Applicant: INTEL CORPORATION, Santa Clara, CA (US)

(72) Inventors: Zhimin Wan, Chandler, AZ (US); Chia-Pin Chiu, Tempe, AZ (US); Chandra Mohan Jha, Tempe, AZ (US); Weihua Tang, Chandler, AZ (US); Shankar Devasenathipathy, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 839 days.

(21) Appl. No.: 16/144,584

(22) Filed: Sep. 27, 2018

(65) Prior Publication Data
US 2020/0105643 A1    Apr. 2, 2020

(51) Int. Cl.
*H01L 23/473*    (2006.01)
*H01L 25/18*    (2006.01)
*H01L 23/467*    (2006.01)
H01L 23/367    (2006.01)
H01L 23/373    (2006.01)

(52) U.S. Cl.
CPC .......... *H01L 23/473* (2013.01); *H01L 23/467* (2013.01); *H01L 25/18* (2013.01); *H01L 23/367* (2013.01); *H01L 23/3736* (2013.01)

(58) Field of Classification Search
CPC .... H01L 23/467; H01L 23/473; H01L 23/427
See application file for complete search history.

(56) References Cited

U.S. PATENT DOCUMENTS

2015/0179617 A1* 6/2015 Lin ...................... H01L 25/0652
257/713

* cited by examiner

*Primary Examiner* — Tucker J Wright
(74) *Attorney, Agent, or Firm* — Schwabe, Williamson & Wyatt, P.C.

(57) ABSTRACT

An integrated heat spreader includes channel structures assembled in a frame. Each channel structure is independent of the other, and can be used to dissipate heat from integrated circuitry at a specific location within a package, and without allowing heat from that particular location to propagate to integrated circuitry at other locations within the package. Each channel structure can be implemented with metal having a high thermal conductivity (e.g., copper). The channel structures can be used in conjunction with liquid-based cooling or air-based cooling. The frame can be implemented with low thermal conductivity molding compound or plastic so the heat transfer from one channel structure to another is inhibited. The channel structures can have different configurations (e.g., straight, pillars, and/or pin fins) to provide different rates of flow, mixing, and/or cooling. The flow direction of air or liquid for the channel structures can be the same (parallel) or different (counter).

20 Claims, 7 Drawing Sheets

INTEGRATED HEAT SPREADER WITH MULTIPLE CHANNELS FOR MULTICHIP PACKAGES

BACKGROUND

Integrated circuitry continues to scale to smaller feature dimensions and higher packaging densities. With such scaling, the density of power consumption of a given microelectronic device within a given package tends to increase, which, in turn, tends to increase the average junction temperature of transistors of that device. If the temperature of the microelectronic device becomes too high, the integrated circuits making up that device may be damaged or otherwise suffer performance issues (e.g., sub-optimal performance such as low gain or slow switching speeds, or catastrophic failure where one or more portions of the integrated circuitry is destroyed). This issue is exacerbated when multiple microelectronic devices are incorporated in close proximity to one another in a given die layout. Thus, thermal transfer solutions, such as integrated heat spreaders, must be utilized to remove heat from such microelectronic devices. There are a number of non-trivial and unresolved issues associated with thermal management.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

An integrated heat spreader design is disclosed that includes multiple channel structures assembled in a frame. Each channel structure is independent of the other, and can be used to dissipate heat from integrated circuitry at a specific location within a semiconductor package, and without allowing heat from that particular location to propagate to integrated circuitry at other locations within the package. Each channel structure can be implemented with metal having a high thermal conductivity (e.g., copper or silver). The channel structures can be used in conjunction with liquid-based cooling or air-based cooling, where either cooling liquid or air flows through the respective channel structures. The frame can be implemented with low thermal conductivity molding compound or plastic so the heat transfer from one channel structure to another is inhibited. The channel structures can have different configurations with respect to channel geometry and/or features. For instance, some channel structures may have narrow channels while other structures have wider channels, or a single channel structure may have both wide and narrow channels. Likewise, some channel structures may have straight channels formed with fins only, or channels formed with outer fins and inner pillars. In any such cases, pin fins may also be provisioned, for example, on the fins and/or pillars. The flow direction of air or liquid for the channel structures can be the same (referred to as parallel-flow) or different (referred to as counter-flow). Numerous variations and embodiments will be appreciated.

General Overview

Figure 1:
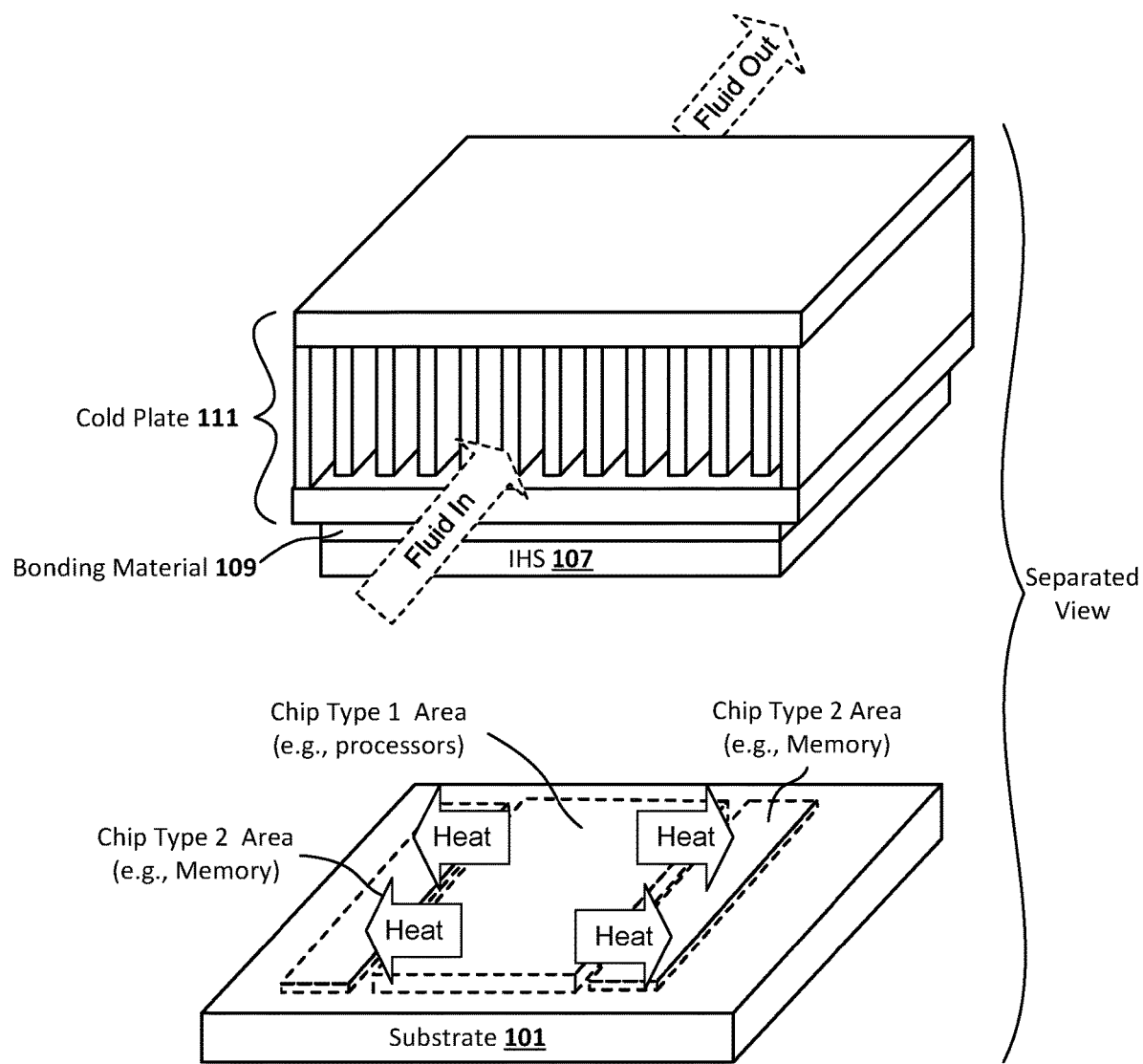
FIG. 1 illustrates a perspective, partially separated view of an integrated circuit package including a multichip substrate that is cooled with an integrated heat spreader and cold plate assembly, and how that assembly allows heat to spread from a central chip area of the substrate to outer chip areas.

As previously explained, there a number of non-trivial and unresolved issues associated with thermal management solutions for integrated circuitry, particularly with respect to integrated circuit packages that include a combination of die that require very high-power. For instance, consider a semiconductor package that includes both processors (e.g., central processing unit and graphics processing unit, or CPU and GPU) and memory (e.g., high bandwidth memory, or HBM), along with an integrated heat spreader that covers both the processors and memory. In such cases, the processors may consume very high-power (e.g., on the order of hundreds of Watts). On the other hand, the thermal resistance of the memory (particularly stacked memory configurations) may be relatively high, which in turn limits its power (e.g., less than 30 Watts). For such high-power package configurations, liquid cooling can be used. However, one problem for such high-power package configurations is the thermal crosstalk allowed by the integrated heat spreader. In particular, the integrated heat spreader effectively allows heat to be spread from the relatively much hotter processors to the lesser hot memory, thereby heating the memory. FIG. 1 shows an example such configuration, where the chip type 1 area in the center of substrate 101 includes relatively high-power integrated circuitry (such as CPU and/or GPU, or other high-power circuitry), and the chip type 2 areas at opposing edges of the substrate 101 include relatively low-power integrated circuitry (such as HBM, or other relatively lower power circuitry). As can be seen, during operation of the integrated circuitry, and with a cooling assembly over the substrate 101 and including an integrated heat spreader 107 bonded to a cold plate 111 by bonding material 109, heat flows from the chip type 1 area through the heat spreader to the chip type 2 areas. One possible solution to this unwanted heat spreading issue is to slit the integrated heat spreader 107 between the chip type 1 and chip type 2 areas, while having the cold plate 111 on top of the integrated heat spreader 107. While such slitting would help reduce the thermal crosstalk through the integrated heat spreader 107, the heat from the chip type 1 area still can be transferred to the chip type 2 areas through the cold plate 111.

Thus, an integrated heat spreader design is disclosed that includes multiple channel structures assembled in a frame. Each channel structure is independent of the other channel structures, and can therefore be used to dissipate heat from underlying integrated circuitry at a specific location within a given package, and without allowing heat from that particular location to propagate to integrated circuitry at other locations within the package. Each channel structure can be implemented, for instance, with copper or silver or other metal having a high thermal conductivity (e.g., K>200 W/m-K, or >300 W/m-K). In some embodiments the channel structures are used in conjunction with liquid cooling, where a cooling fluid flows through each channel structure. In other example embodiments, the channel structures may be used with air-based cooling, where cooled or ambient air flows through each channel structure. The frame can be implemented, for example, with low thermal conductivity molding compound or plastic or other suitable poor heat conductor (e.g., K<0.5 W/m-K, or <0.3 W/m-K), so that undesired lateral heat transfer from one channel structure to another within the same frame can be minimized or otherwise inhibited. So, for instance and with reference to the example semiconductor package shown in FIG. 1, the heat generated by the integrated circuitry in the chip type 1 area cannot significantly transfer to (and heat up) the integrated circuitry in the chip type 2 areas, or vice-versa.

The channel-and-frame design is flexible, as the channel structures can have different configurations, as will be appreciated. For instance, in one example embodiment, three separate channel structures are provisioned, with the outer structures configured to pass a higher volume of cooling fluid (relative to the middle structure), thereby providing a higher degree of cooling to integrated circuitry at the perimeter of the package. Straight channels within a given channel structure can be used in some embodiments, while in other configurations straight channels can be replaced by metal pillars (e.g., stalactites, stalagmites, and/or floor-to-ceiling pillars) to get more benefit from the increased flow rate and/or mixing. In any such cases, pin fins may also be used in the channels to further enhance cooling as well as coolant mixing (whether the coolant be cooling fluid or air). The pin fins can be, for example, on fins making up individual channels within a given channel structure, and/or on pillars within the channel(s) of a given channel structure. In addition, further note that the flow direction (whether air-based cooling or liquid-based cooling) for the channel structures can be the same so as to provide a parallel-flow arrangement, but in other example embodiments the flow direction for the channel structures is in different directions so as to provide a counter-flow arrangement to inhibit temperature stacking that may occur with parallel-flows. Numerous flow schemes can be used, as will be appreciated.

Various benefits and advantages may be realized with respect to one or more embodiments provided herein. For instance, and as will be further appreciated, note that the integrated heat spreader designs provided herein can be used without a traditional cold plate, and can be used in conjunction with cooling fluid or air-based cooling. In addition, further note that the channel structures can be tailored to provide flow rates that are customized to the cooling needs associated with a given area within a given semiconductor package. Such customization is particularly useful if the overall flowrate to a given package is constrained, or if one area of a given package has higher thermal margin than another.

So, for instance, a channel structure having straight and wide channels can be used to allow a higher flow rate to more aggressively cool an area of the package where thermal margin is tight or otherwise constrained. In such cases, a channel structure that is associated with a low-power (low temperature) area within the package can be configured more narrowly to provide lower flow rate, which in some cases may in turn effectively provide extra flow rate budget that can be used elsewhere in the package.

Likewise, the cooling scheme can be optimized to the particulars of a given semiconductor package layout, so as to efficiently use available thermal margins. For instance, consider the example case where CPU/GPU power (e.g., chip type 1 area) is about 200 Watts, and HBW power (e.g., chip type 2 areas) is about 15 Watts. In one such example case, the HBM temperature can be reduced by about 5 to 10° C. (e.g., 6° C.) by using an integrated heat spreader configured to reduce the thermal crosstalk and further configured with a counter-flow cooling fluid design, according to an embodiment. In such an example case, note that the GPU temperature is increased by about 3.3° C. In a model of this example case, uniform power was used for both HBM and CPU/GPU. Further, assume that the CPU/GPU maximum temperature specification is about 105° C., while the HBM maximum temperature specification is about 85 to 95° C. depending on the refresh rate. In one particular such example case, most of the power of the HBM is concentrated at the bottom die and the stack thermal resistance is very high. Therefore, the HBM temperature is the limiter of package performance, while there is still thermal margin for the area that includes the CPU/GPU die. In this manner, the slight 3.3° C. increase in temperature in the CPU/GPU location is acceptable, given the helpful temperature reduction in the HBM location. Numerous other benefits will be appreciated in light of this disclosure.

Architecture

Figure 2A:
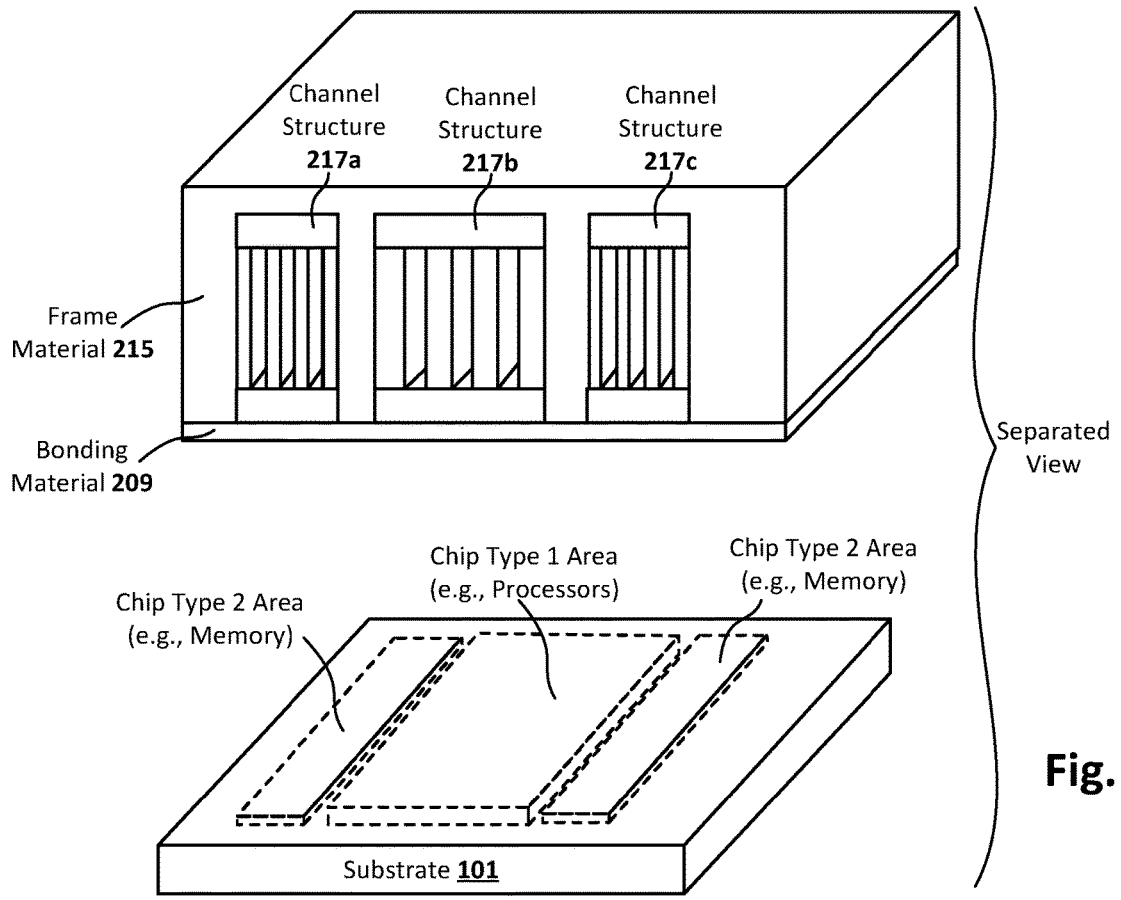
FIG. 2a illustrates a perspective, partially separated view of an integrated circuit package including a multichip substrate that is cooled by an integrated heat spreader configured with distinct channel structures corresponding to different chip areas on the substrate, in accordance with an embodiment of the present disclosure.

FIG. 2a illustrates a perspective, partially separated view of an integrated circuit package including a multichip substrate that is cooled by an integrated heat spreader configured with distinct channel structures corresponding to different chip areas on the substrate, in accordance with an embodiment of the present disclosure.

Figure 2B:
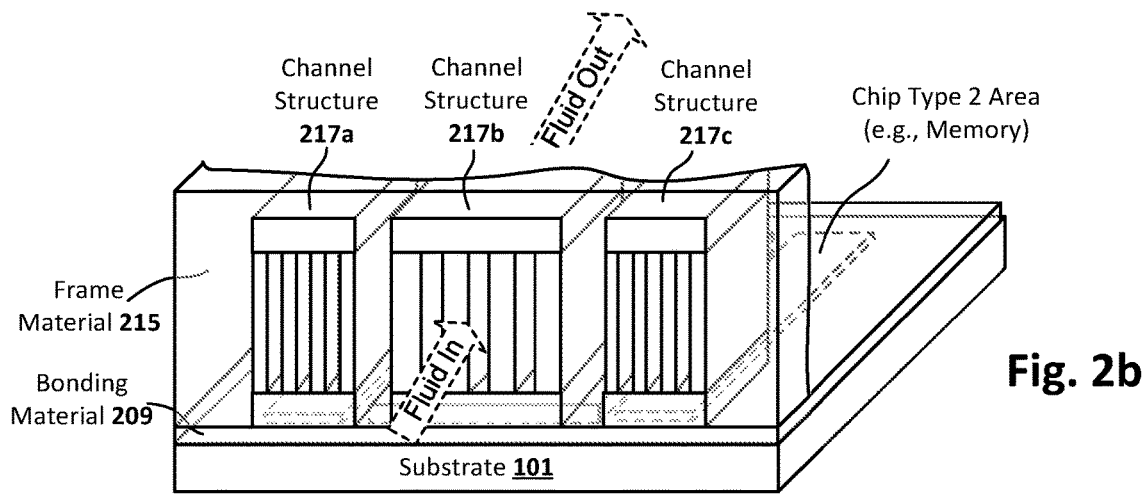
FIG. 2b illustrates a perspective, non-separated but partially cut-away view of the integrated circuit package shown in FIG. 2a, to show how the distinct channel structures correspond to different chip areas on the substrate, in accordance with an embodiment of the present disclosure.

As can be seen, a standard substrate 101 includes a number of integrated circuits thereon, and an integrated heat spreader over the substrate 101 includes channel structures 217a-c encased or otherwise framed and separated from one another in a frame material 215 (e.g., molding compound or other thermally insulative material). The heat spreader is bonded to substrate 101 via a thermally conductive bonding material 209. As can be further seen, the perspective and partially cut-away view of FIG. 2b shows how the channel structures 217a-c correspond to the different chip type areas on the substrate 101. In this particular example case, the channel structures 217a and 217c respectively correspond to the outer chip type 2 areas, and the channel structure 217b corresponds to the chip type 1 area.

The layout and make-up of the substrate 101 and integrated circuitry thereon can be arbitrary, and will vary from one embodiment to the next, but in this particular example case includes a chip type 1 area with chip type 2 areas to either side. The integrated circuit packages or chips within a given area may of course vary as well, but in any such cases may benefit from a cooling scheme as variously provided herein, particularly where undesired thermal crosstalk between chip areas may occur.

One such example case where thermal crosstalk may be undesirable includes multiple processor chips (e.g., CPUs and/or GPUs) in the chip type 1 area, and multiple memory chips (e.g., dynamic random access memory or DRAM, or HBM) in each of the chip type 2 areas. Further assume for purposes of this example case that the chip type 1 area generates significantly more heat (e.g., >3× more) than the chip type 2 areas, and further that the chip type 2 areas effectively define the minimal thermal limit of the package. In such a case, a benefit can be had by inhibiting heat transfer from the chip type 1 area into the chip type 2 areas. Numerous other chip configurations and layouts that can benefit from an embodiment of the present disclosure will be appreciated, and the present disclosure is not intended to be limited to any particular ones.

The channel structures 217 are implemented with a metal or other material having a high thermal conductivity (e.g., >200 W/m-K, or >300 W/m-K), such as copper, silver, gold, or beryllium. In this example case, each channel structure 217 has a plurality of laterally extending fins arranged between top and bottom metal plates so as to provide flow channels between neighboring fins. The width and height and shape of the channels can be tailored to provide a desired flow rate. For instance, note that channels over the chip type 2 areas are depicted in this particular embodiment as being narrower than the channels over the chip type 1 area. In other embodiments, the chip type 2 areas can be wider than the channels over the chip type 1 area, depending on the flow rate of the channels. Other example channel structure 217 configurations will be discussed in turn, with respect to FIGS. 3a-b and 4a-c, including the use of metal pillars and pin fins.

Further note in this example embodiment that a cooling fluid is used, wherein a cool fluid flows into the channels of the channel structures 217, and the spent or heated fluid exits the channels and returns to the heat exchanger. In other embodiments, cool or room temperature air can be used as the coolant that flows through the channels. Whether air-based or fluid-based cooling is used depends on factors such as the power consumed (and heat generated) by the integrated circuitry, and the maximum allowable junction temperature for that integrated circuitry, as will be appreciated.

Frame material 215 can be implemented with any number of commercially available or proprietary semiconductor mold materials or compounds, or plastics, that have relatively low thermal conductivity (e.g., K<0.5 W/m-K, or <0.3 W/m-K), such as those provided by Sumitomo Bakelite. Likewise, the thermally conductive bonding material 109 can be implemented with any number of commercially available or proprietary thermal interface materials (or so-called TIMs), such as thermal grease, thermal elastomers, phase change materials, graphite pads, curable gels, and solders having relatively high thermal conductivity (e.g., K>2 W/m-K, or K>20 W/m-K, or >50 W/m-K, or higher). The present disclosure is not intended to be limited to any specific such frame or bonding materials, as will be appreciated in light of this disclosure.

Figure 3A:
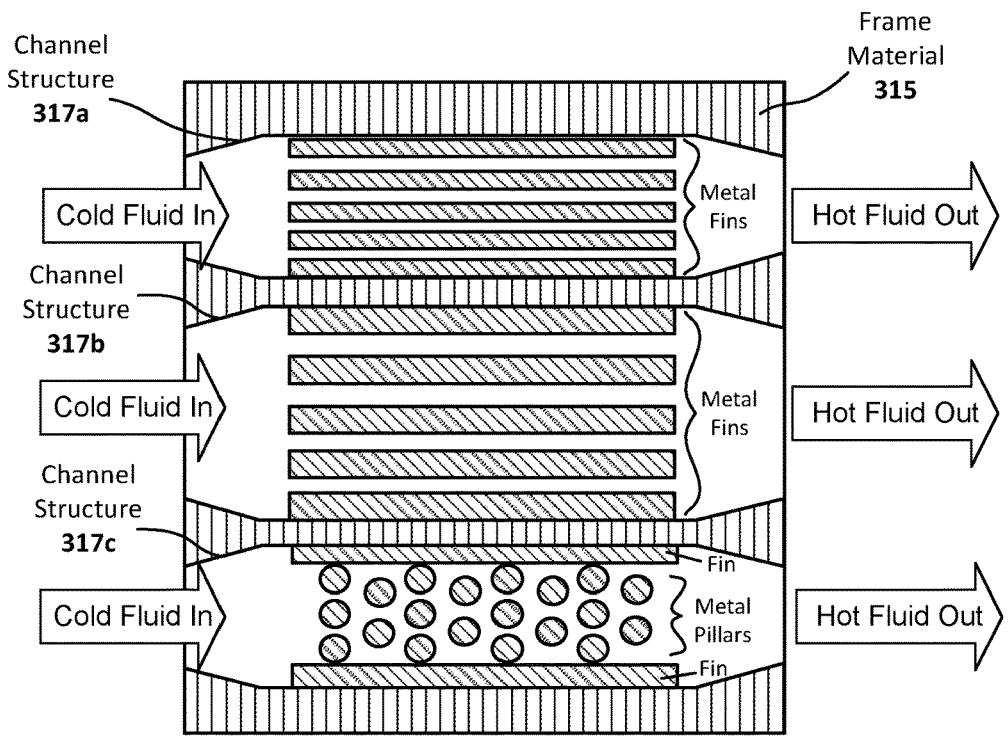
FIG. 3a illustrates a top down view of the integrated heat spreader configured with separate channel structures and parallel-flow of cooling fluid through those structures, in accordance with an embodiment of the present disclosure.

FIG. 3a illustrates a top down view of the integrated heat spreader configured with separate channel structures and parallel-flow of cooling fluid through those structures, in accordance with an embodiment of the present disclosure. As can be seen, this example includes three distinct channel structures 317a, 317b, and 317c, encased in or otherwise separated from each other by frame material 315. Each channel structure 317 can be configured independently of the other channel structures, so that specific cooling needs of corresponding areas of the underlying integrated circuitry can be addressed.

Channel structure 317a includes a number of metal fins (cross-hatched) that extend from an inlet to an outlet. The fins are straight in this example case, but in other example cases may be configured in a zig-zag, or saw, or other non-straight manner. Straight channels allow for fast flow rates, whereas non-straight channels are more disruptive to the flow and cause greater mixing of the coolant. Different cooling applications may benefit from different types of flows, as will be appreciated. The fins are disposed between top and bottom plates (the top plate is removed for purposes of this top down view, to show example details of the channel structure configuration). Channel structure 317b also includes a number of metal fins sandwiched between metal plates, but the fins of 317b are wider, and the channels between those fins are wider. Channel structure 317c includes both metal fins defining a main channel, and a plurality of metal pillars disposed within that channel in a pattern. Other embodiments may include only two types of channel structures (e.g., where 317a and 317c are the same), while other embodiments may include four or more types of channel structures. Any number of channel configurations can be used depending on the given cooling application, as will be appreciated in light of this disclosure.

As previously explained, the materials can vary from one embodiment to the next, but in one example case, the fins, top plate, and bottom plate are copper, and the frame material is a thermally insulative material such as plastic or molding compound having a thermal conductivity of <0.5 Watts per meter-Kelvin (W/m-K), or <0.3 W/m-K. Note that in some cases the fins within a given channel structure 317 may be similar in geometry, while in other cases some fins of a given channel structure 317 may be wider or otherwise shaped differently to provide distinct flow patterns (suitable for a given application) within that same channel structure 317. Likewise, the channels within a given channel structure 317 may be similar in geometry, while in other cases some channels of a given channel structure 317 may be wider or otherwise shaped differently to provide distinct flow patterns (suitable for a given application) within that same channel structure 317. In a channel structure 317 including metal pillars (such as 317c), the pillars may fully extend between the top and bottom plates, or only partially extend from the bottom plate into the channel (but not to the top plate), or from the top plate into the channel (but not to the bottom plate), or some combination of these pillar types. The pillars may be arranged arbitrarily in the channel or in a specific pattern suitable for a given application.

Figure 3B:
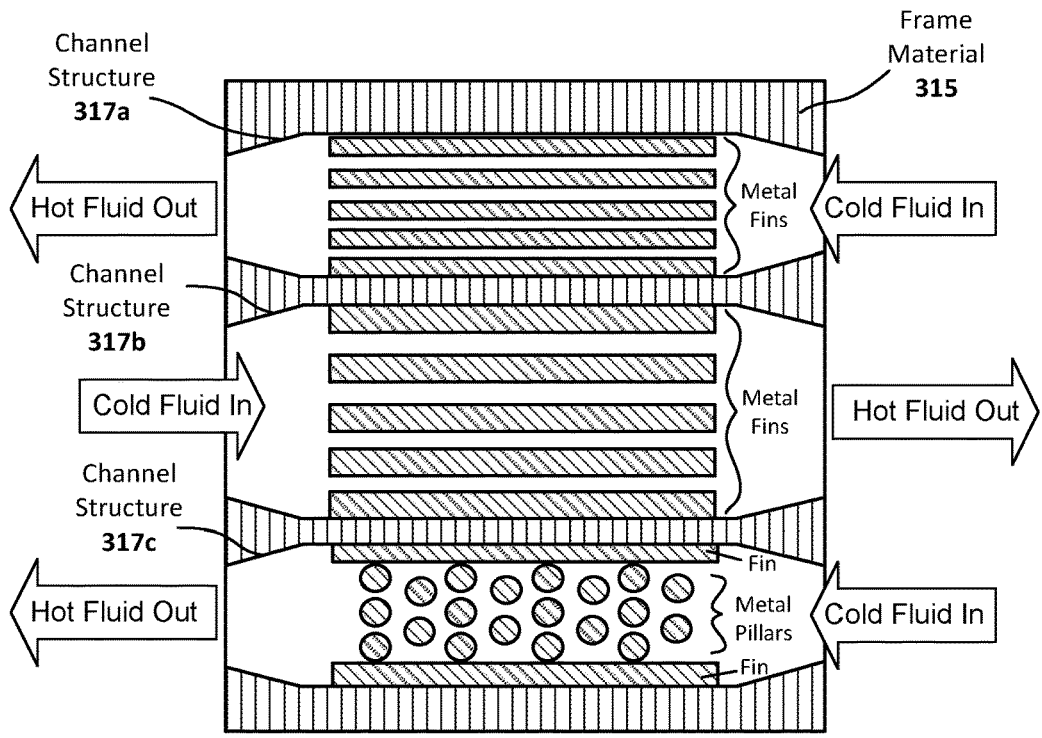
FIG. 3b illustrates a top down view of the integrated heat spreader configured with three separate channel structures and counter-flow of cooling fluid through those structures, in accordance with another embodiment of the present disclosure.

FIG. 3b illustrates a top down view of the integrated heat spreader configured with three separate channel structures and counter-flow of cooling fluid through those structures, in accordance with another embodiment of the present disclosure. As can be seen, this example configuration is similar to that shown in FIG. 3a, except that a counter-flow cooling scheme is used. The previous relevant discussion is equally applicable here. Such a counter-flow scheme may prevent heat stacking (or a hotspot) from developing between, for example, the outlet of channel structure 317a and the inlet of channel structure 317b, as well as between the outlet of channel structure 317c and the inlet of channel structure 317b. This is because the fresh coolant provided at the inlet of channel structure 317b offsets the heat associated with the spent coolant exiting at the outlets of channel structures 317a and 317c. Other such benefits of counter-flow cooling will be apparent.

Figure 4A:
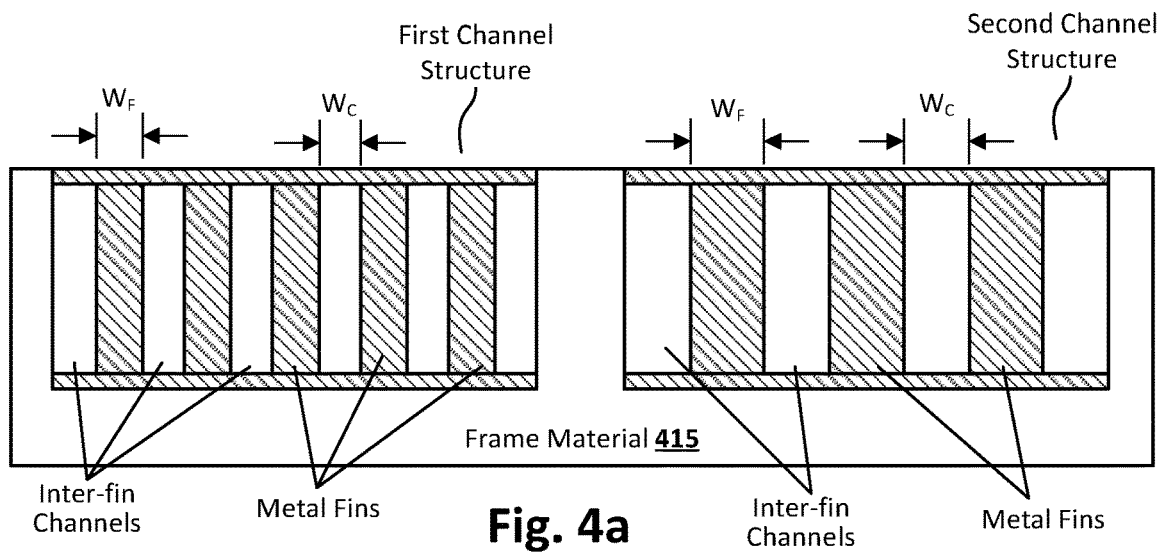
FIGS. 4a through 4c each illustrates a cross-sectional view of the integrated heat spreader configured with diverse channel structures, in accordance with an embodiment of the present disclosure.
Figure 4B:
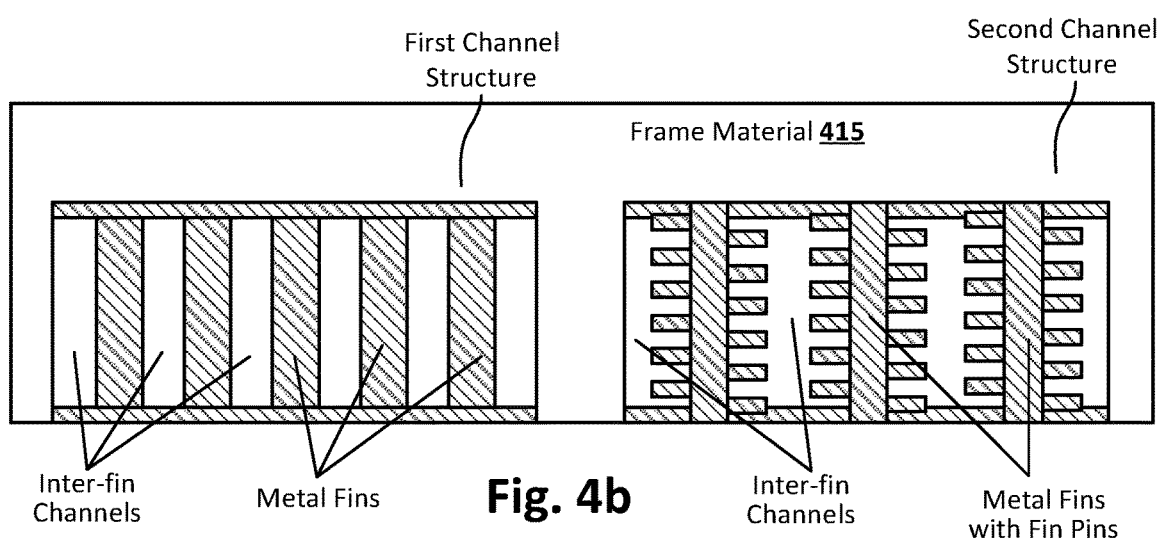
Figure 4C:
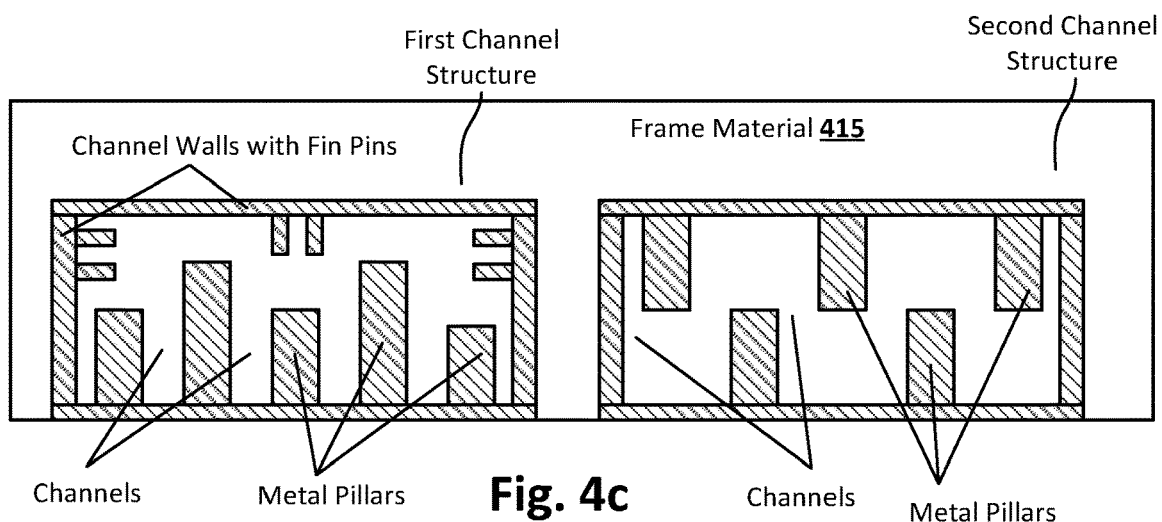

FIGS. 4a through 4c each illustrates a cross-sectional view of the integrated heat spreader configured with diverse channel structures, in accordance with an embodiment of the present disclosure. As can be seen in each of FIGS. 4a-c, first and second channel structures are encased in and separated from each other by frame material 415.

In FIG. 4a, the first and second channel structures include metal fins extending between top and bottom metal plates. The width $W_F$ of the fins of the first channel structure is narrower than the width $W_F$ of the fins of the second channel structure (e.g., about 50% narrower). Likewise, the width $W_C$ of the channels of the first channel structure is narrower than the width $W_C$ of the channels of the second channel structure (e.g., about 50% narrower). However, further note that the first channel structure has a greater number of channels than the second channel structure, thereby increasing the surface area of the thermally conductive material (e.g., copper) that can expel heat to the coolant.

In FIG. 4b, the first channel structure is similar to that in FIG. 4a, but the second channel structure includes fins having pin fins thereon. As previously explained, pin fins can further assist with coolant mixing and further increase the surface area of thermally conductive material (e.g., copper) that can expel heat to the coolant. In other embodiments, the fins of the second channel structure are actually floor-to-ceiling pillars, with only one row of the pillars visible in the cross-section shown.

In FIG. 4c, the first channel structure includes a number of metal pillars extending from the bottom plate, and pin fins (or other protuberances) on the top and sidewalls of the overall channel. Note that the metal pillars vary in height. In other embodiments, they may also (or alternatively) vary in width, and/or be configured with pin fins or protuberances. The second channel structure also includes a number of pillars, with some extending from the bottom plate, and some extending from the top plate. Again, pillar geometry may vary to provide a desired flow within the overall channel.

In any such cases, the channel structure features can be sized and shaped to provide microchannels (or nanochannels, or any sized channels, as the case may be) that provide a coolant flow suitable for a given application.

Fabrication Methodology

Figure 5A:
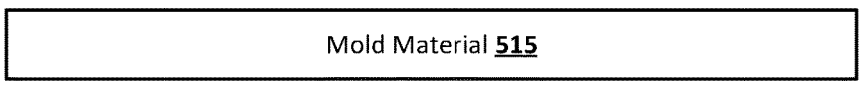
FIGS. 5a through 5e show a series of cross-sectional views that collectively illustrate a method forming an integrated heat spreader configured with independent channel structures, in accordance with an embodiment of the present disclosure.
Figure 5B:
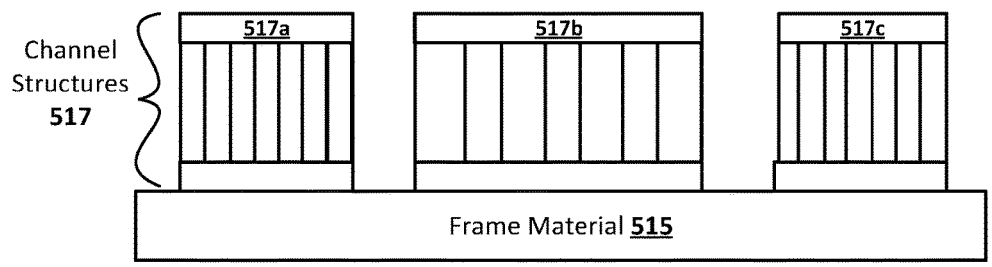
Figure 5C:
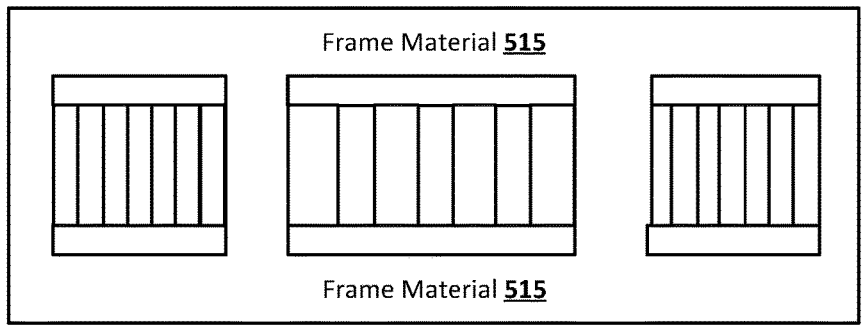
Figure 5D:
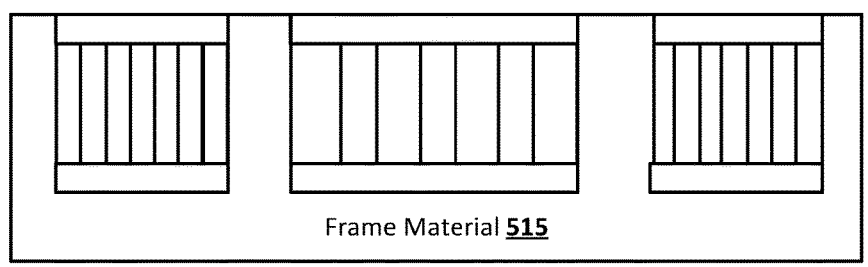
Figure 5E:
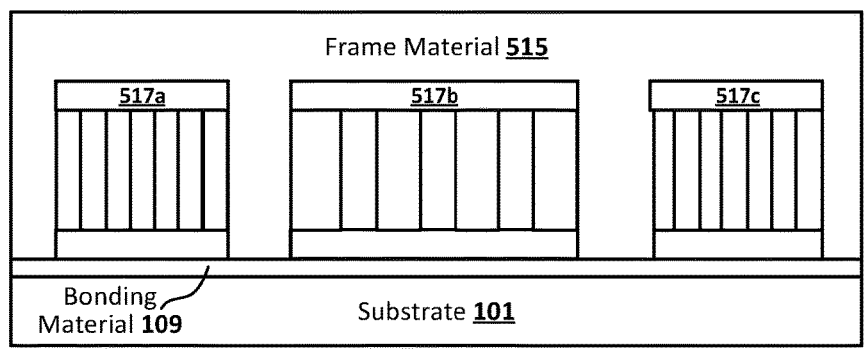

FIGS. 5a through 5e show a series of cross-sectional views that collectively illustrate a method forming an integrated heat spreader configured with independent channel structures, in accordance with an embodiment of the present disclosure. As can be seen in FIG. 5a, the process includes provisioning a base of molding compound or other thermally insulative frame material 515. As shown in FIG. 5b, three pre-fabricated microchannel structures 517a-c are placed on top of the frame base. The method continues with over-molding the microchannel structures 517a-c, so as to encase and thermally isolate those structures within a frame of frame material 515, as shown in FIG. 5c. Once the frame material 515 is set or cured, the process continues with removing excess frame material to expose the metal plates of the microchannel structures 517a-c, as shown in FIG. 5d. This can be accomplished, for example, with standard grinding, although any number of other suitable processes can be used that remove frame material to expose the plates. The resulting structure can then be bonded to substrate 101. As previously explained, bonding material 109 is thermally conductive and allows heat to dissipate from the underlying integrated circuitry into the exposed metal plate of the corresponding channel structure 517. The coolant (air or cooling fluid) flowing through the channel structures pulls that heat out (or at least a portion of that heat), thereby lowering the operating temperature of the integrated circuitry.

For a copper channel structure, the thermal conductivity is about 400 W/m-K. As previously explained, the frame material 415 can be thermally insulative material such as a molding compound or plastic with thermal conductivity 0.5 W/m-K or less.

Figure 6A:
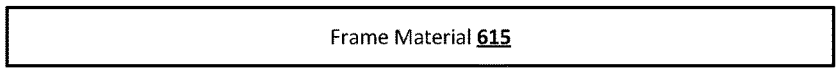
FIGS. 6a through 6h show a series of cross-sectional views that collectively illustrate a method forming an integrated heat spreader configured with independent channel structures, in accordance with another embodiment of the present disclosure.
Figure 6B:
Figure 6C:
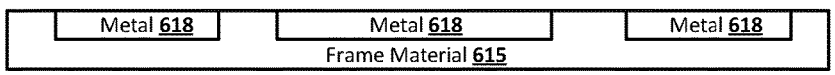

FIGS. 6a through 6h show a series of cross-sectional views that collectively illustrate a method forming an integrated heat spreader configured with independent channel structures, in accordance with another embodiment of the present disclosure. In this example case, rather than using pre-fabricated channel structures, the formation of the channel structures is integrated into the overall process. As can be seen in FIG. 6a, the process includes depositing a base of frame material 615. The frame material 615 is thermally insulative material such as a plastic or mold material or other material having sufficiently low thermal conductivity (e.g., K<0.5 W/m-K). As shown in FIG. 6b, the frame base is patterned and etched to provide three horizontal trenches that will be filled to form the top plates (or bottom plates, as the case may be) of the channel structures 617. FIG. 6c shows the resulting structure after metal 618 (e.g., copper, silver, or other high thermal conductivity material) is deposited into the trenches, and any excess metal is ground or otherwise planarized away, down to the top surface of the base.

Figure 6D:
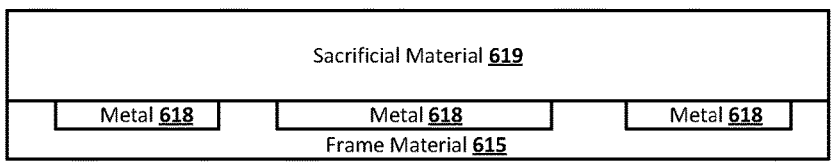
Figure 6E:
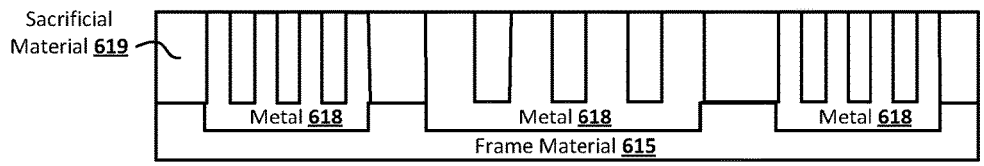
Figure 6F:
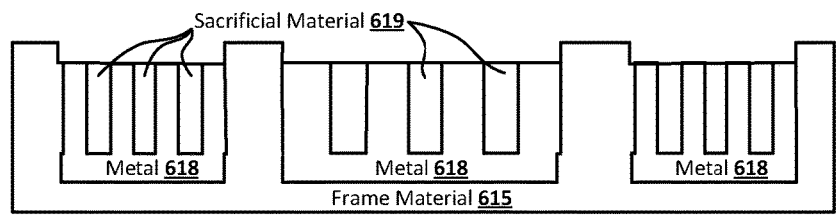
Figure 6G:
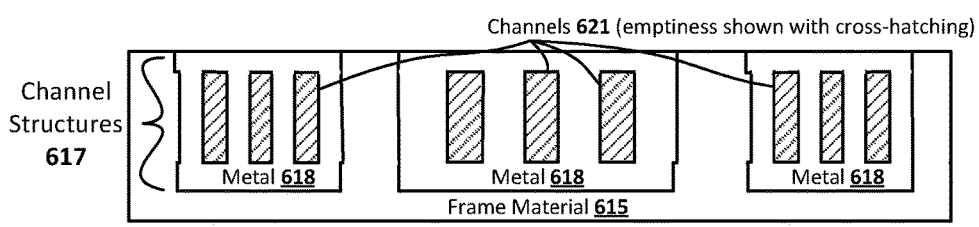
Figure 6H:
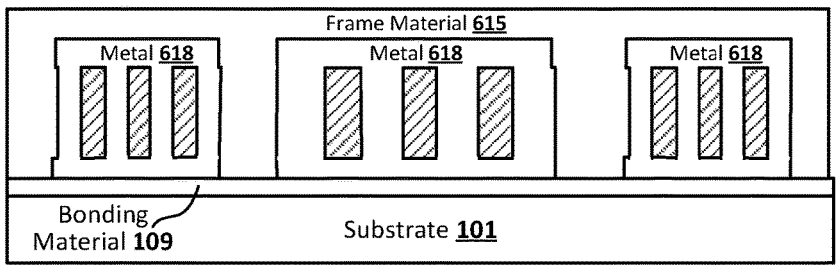

As can be seen in FIG. 6d, a layer of sacrificial material 619 is deposited on the structure. The sacrificial material 619 can be a plastic, oxide, or nitride, or any other material that can be selectively etched, such that the etch scheme used removes the sacrificial material 619 at a much higher rate than it removes metal 618 or frame material 615. As can be seen in FIG. 6e, sacrificial material 619 is patterned and etched, and metal 618 is deposited into the vertical trenches to provide the vertical trenches for fin portions of the channel structures 617, and any excess metal is ground or otherwise planarized away, down to the top surface of the sacrificial material 619. Then, as can be seen in FIG. 6f, the sacrificial material 619 outside the fin areas is removed and replaced with more frame material 615, and the frame material 615 is patterned and etched to form horizontal trenches that will be filled to form the bottom (or top) plates of the channel structures 617. FIG. 6g shows the resulting structure after more metal 618 is deposited into the trenches, and any excess metal is ground or otherwise planarized away, down to the surface of the frame material 615 so as to expose the metal plates of the channel structures 617. In addition, the sacrificial material 619 between the fins is then removed to form empty channels 621 through which a coolant can flow, such as liquid coolant, chilled air, or ambient air. The emptiness of channels 621 is shown with cross-hatching in this example depiction. As will be appreciated, a selective etch process can be used to remove the remaining sacrificial material 619 to form the empty channels 621, such as an etchant that is selective to metal 618 and mold material 615 but not the sacrificial material 619 (i.e., the etchant removes sacrificial material 619 at a much higher rate than metal 618 and material 615). The resulting structure can then be bonded to substrate 101, by way of bonding material 109, as previously explained.

In still other embodiments, the structures shown in FIG. 5d or 6g can be formed by way of 3D printing technology, as will be appreciated. Any number of forming techniques can be used.

Computing System

Figure 7:
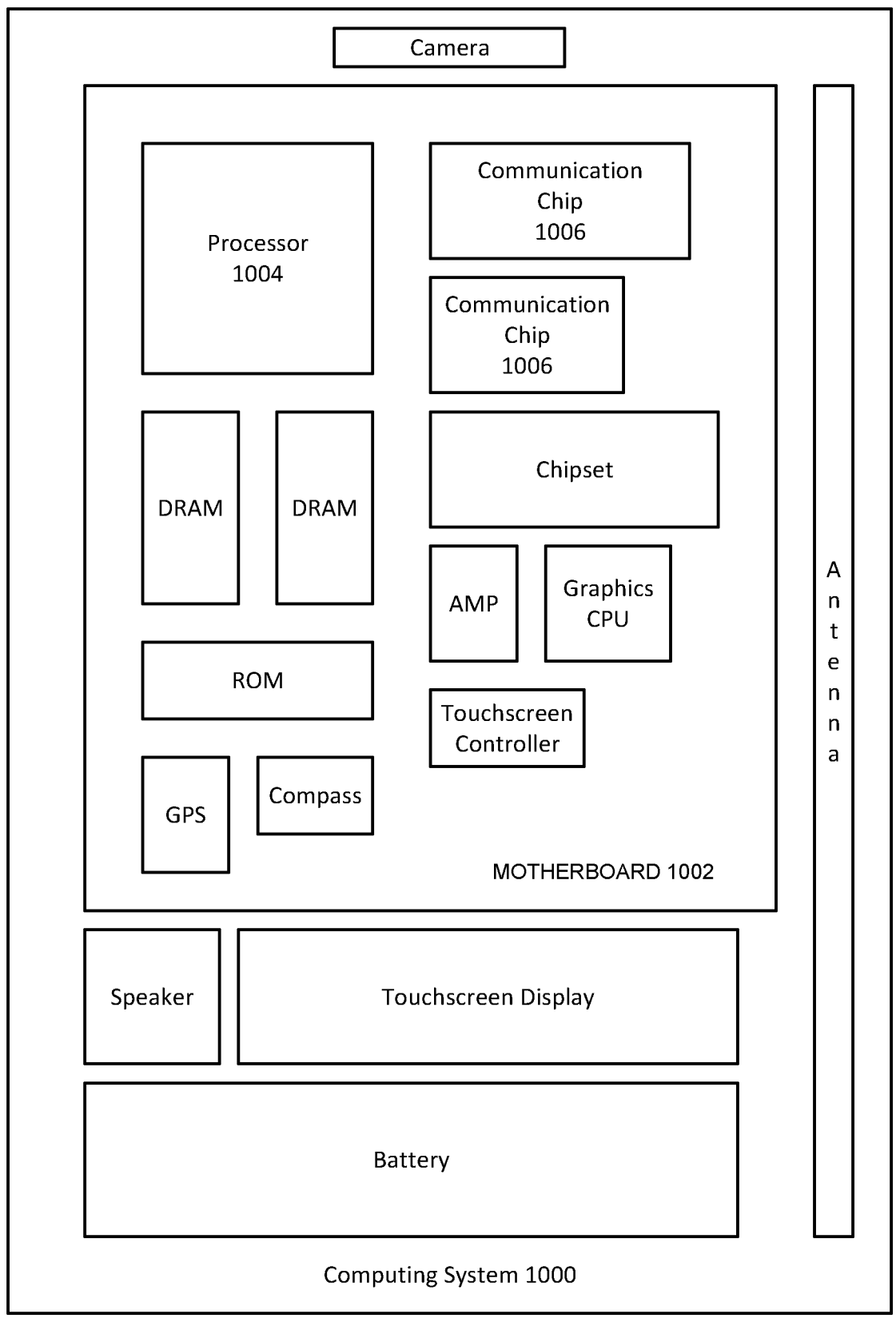
FIG. 7 illustrates a computing system implemented with one or more multichip packages having a channelized heat spreader, in accordance with an embodiment of the present disclosure.

FIG. 7 illustrates a computing system implemented with one or more integrated circuit packages configured in accordance with an embodiment of the present disclosure. As can be seen, the computing system 1000 houses a motherboard 1002. The motherboard 1002 may include a number of components, including but not limited to a processor 1004 and at least one communication chip 1006 (two are shown in this example), each of which can be physically and electrically coupled to the motherboard 1002, or otherwise integrated therein. As will be appreciated, the motherboard 1002 may be, for example, any printed circuit board or card-level assembly, whether a main board or a daughterboard mounted on a main board or the only board of system 1000, or a card installed in the chassis of system 1000. Depending on its applications, computing system 1000 may include one or more other components that may or may not be physically and electrically coupled to the motherboard 1002. In an embodiment, these other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more packages having a channelized heat spreader that includes multiple channel structures, as variously described herein. In some example embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. The processor 1004 of the computing system 1000 includes an integrated circuit die packaged within the processor 1004. In some example embodiments of the present disclosure, the processor 1004 has a channelized heat spreader configuration as variously described herein, including angled or sloping or tilted metal features that dissipate heat both vertically and laterally, or otherwise include a rise-and-run aspect. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the communication chip 1006 has a channelized heat spreader as variously described herein, including metal features that include a rise-and-run aspect so as to dissipate heat both vertically and laterally. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs one or more channelized heat spreader configurations as variously provided herein. As will be appreciated in light of this disclosure, various embodiments of the present disclosure can be used to improve performance on products fabricated at any process node (e.g., in the micron range, or sub-micron and beyond) by allowing for the use of multichip package configurations.

Further Example Embodiments

The following examples pertain to further embodiments, from which numerous permutations and configurations will be apparent.

Example 1 includes an integrated circuit package, including: a first die area on a substrate, the first die area including a first die; a second die area on the substrate and laterally adjacent to the first die area, the second die area including a second die; a first channel structure over the first die area and in thermal contact with the first die, the first channel structure having a thermal conductivity of greater than 200 Watts per meter-Kelvin (W/m-K), the first channel structure defining one or more channels through which coolant can flow; a second channel structure over the second die area and in thermal contact with the second die, the second channel structure having a thermal conductivity of greater than 200 W/m-K, the second channel structure defining one or more channels through which coolant can flow; and a thermally insulative material separating the first and second channel structures.

Example 2 includes the subject matter of Example 1, wherein the first and second channel structures include vertical fins extending between top and bottom surfaces, thereby forming the one or more channels.

Example 3 includes the subject matter of Example 1 or 2, wherein at least one of the first and second channel structures includes vertical pillars.

Example 4 includes the subject matter of Example 3, wherein, wherein at least some of the vertical pillars extend from a first surface of the corresponding channel structure and do not reach a second surface opposite the first surface. To this end, the pillars may be similar to a stalagmite or a stalactite like configuration.

Example 5 includes the subject matter of Example 3, wherein at least some of the vertical pillars extend from a first surface of the corresponding channel structure to a second surface opposite the first surface.

Example 6 includes the subject matter of any of the preceding Examples, wherein at least one of the first and second channel structures includes pin fins.

Example 7 includes the subject matter of Example 6, wherein one or more of the pin fins are on sidewalls of at least one of the first and second channel structures.

Example 8 includes the subject matter of Example 6 or 7, wherein one or more of the pin fins are on one or more pillars of at least one of the first and second channel structures.

Example 9 includes the subject matter of any of Examples 6 through 8, wherein one or more of the pin fins are on one or more fins of at least one of the first and second channel structures.

Example 10 includes the subject matter of any of the preceding Examples, wherein the coolant flows through the first channel structure in a first direction, and the coolant flows through the second channel structure in a second direction that is opposite the first direction.

Example 11 includes the subject matter of any of the preceding Examples, wherein the coolant is air.

Example 12 includes the subject matter of any of Examples 1 through 10, wherein the coolant is a cooling fluid.

Example 13 includes the subject matter of any of the preceding Examples, wherein the first and second channel structures comprise copper or silver.

Example 14 is a card that includes the integrated circuit package of any of the preceding Examples. The card may be, for instance, a graphics processing card or a mother board or a printed circuit board, to name a few examples.

Example 15 is chassis that includes the integrated circuit package of any of Examples 1 through 13, or the card of Example 14. The chassis can be part of an overall bigger system and may include multiple cards and/or other components and features, as will be appreciated.

Example 16 is an electronic system that includes the integrated circuit package of any of Examples 1 through 13, or the card of Example 14, or the chassis of Example 15. The system can be, for instance, a computing system, a server computer system, a mobile computing system such as a laptop or smartphone, or a game console, to name a few examples.

Example 17 is an integrated circuit package, including: a first die area on a substrate, the first die area including a first die; a second die area on the substrate and laterally adjacent to the first die area, the second die area including a second die; a first metal channel structure over the first die area and in thermal contact with the first die, the first metal channel structure defining one or more channels through which coolant can flow; a second metal channel structure over the second die area and in thermal contact with the second die, the second metal channel structure defining one or more channels through which coolant can flow; and a frame material around the first and second metal channel structures, the frame material comprising a thermally insulative material, thereby inhibiting heat transfer between the first and second metal channel structures.

Example 18 includes the subject matter of Example 17, wherein the first and second metal channel structures include vertical fins extending between top and bottom surfaces, thereby forming the one or more channels.

Example 19 includes the subject matter of Example 17 or 18, wherein at least one of the first and second metal channel structures includes vertical pillars.

Example 20 includes the subject matter of Example 19, wherein at least some of the vertical pillars extend from a first surface of the corresponding metal channel structure and do not reach a second surface opposite the first surface.

Example 21 includes the subject matter of Example 19, wherein at least some of the vertical pillars extend from a first surface of the corresponding metal channel structure to a second surface opposite the first surface.

Example 22 includes the subject matter of any of Examples 17 through 21, wherein at least one of the first and second metal channel structures includes pin fins.

Example 23 includes the subject matter of Example 22, wherein one or more pin fins are on sidewalls of at least one of the first and second metal channel structures.

Example 24 includes the subject matter of Example 22 or 23, wherein one or more pin fins are on one or more pillars of at least one of the first and second metal channel structures.

Example 25 includes the subject matter of any of Examples 22 through 24, wherein one or more pin fins are on one or more fins of at least one of the first and second metal channel structures.

Example 26 includes the subject matter of any of Examples 17 through 25, wherein the coolant flows through the first metal channel structure in a first direction, and the coolant flows through the second metal channel structure in a second direction that is opposite the first direction.

Example 27 includes the subject matter of any of Examples 17 through 27, and further includes: a third die area on the substrate and laterally adjacent to the first die area, the third die area including a third die, wherein the first die area is between the second die area and the third die area; and a third metal channel structure over the third die area and in thermal contact with the third die, the third metal channel structure defining one or more channels through which coolant can flow.

Example 28 includes the subject matter of Example 27, wherein the coolant flows through the second and third metal channel structures in a first direction, and the coolant flows through the first metal channel structure in a second direction that is opposite the first direction.

Example 29 includes the subject matter of Example 27 or 28, wherein the second die and the third die are the same die type, and the first die generates more heat than the second and third die.

Example 30 includes the subject matter of any of Examples 27 through 29, wherein the second die and the third die are memory die, and the first die is a processor die.

Example 31 includes the subject matter of any of Examples 17 through 30, wherein the coolant is air.

Example 32 includes the subject matter of any of Examples 17 through 30, wherein the coolant is a cooling fluid.

Example 33 includes the subject matter of any of Examples 17 through 32, wherein the first and second metal channel structures comprise copper or silver.

Example 34 is card including the integrated circuit package of any of Examples 17 through 33.

Example 35 is a chassis including the integrated circuit package of any of Examples 17 through 33, or the card of Example 34.

Example 36 is an electronic system including the integrated circuit package of any of Examples 17 through 33, or the card of Example 34, or the chassis of Example 35.

Example 37 is a method forming an integrated circuit package, including: providing a first metal channel structure over a first die area on a substrate and in thermal contact with a first die within the first die area, the first metal channel structure defining one or more channels through which coolant can flow; providing a second channel structure over a second die area on the substrate and in thermal contact with a second die within the second die area, the second die area laterally adjacent to the first die area, the second metal channel structure defining one or more channels through which coolant can flow; and providing a thermally insulative material so as to thermally separate the first and second metal channel structures.

Example 38 includes the subject matter of Example 37, wherein the first and second metal channel structures include vertical fins extending between top and bottom surfaces, thereby forming the one or more channels.

Example 39 includes the subject matter of Example 37 or 38, wherein at least one of the first and second metal channel structures includes vertical pillars.

Example 40 includes the subject matter of Example 39, wherein at least some of the vertical pillars extend from a first surface of the corresponding metal channel structure and do not reach a second surface opposite the first surface.

Example 41 includes the subject matter of Example 39, wherein at least some of the vertical pillars extend from a first surface of the corresponding metal channel structure to a second surface opposite the first surface.

Example 42 includes the subject matter of any of Examples 37 through 41, wherein at least one of the first and second metal channel structures includes pin fins.

Example 43 includes the subject matter of Example 42, wherein one or more pin fins are on sidewalls of at least one of the first and second metal channel structures.

Example 44 includes the subject matter of Example 42 or 43, wherein one or more pin fins are on one or more pillars of at least one of the first and second metal channel structures.

Example 45 includes the subject matter of any of Examples 42 through 44, wherein one or more pin fins are on one or more fins of at least one of the first and second metal channel structures.

Example 46 includes the subject matter of any of Examples 37 through 45, wherein the first and second metal channel structures comprise copper or silver.

Example 47 includes the subject matter of any of Examples 37 through 46, and further includes: providing a third metal channel structure over a third die area and in thermal contact with a third die within the third die area, the third die area laterally adjacent to the first die area such that the first die area is between the second die area and the third die area, the third metal channel structure defining one or more channels through which coolant can flow.

Example 48 includes the subject matter of Example 47, wherein the second die and the third die are the same die type, and the first die generates more heat than the second and third die.

Example 49 includes the subject matter of Example 47 or 48, wherein the second die and the third die are memory die, and the first die is a processor die.

Example 50 includes the subject matter any of Examples 37 through 49, wherein the first and second metal channel structures are pre-fabricated. In other embodiments, the first and second metal channel structures (or more) can be fabricated in-situ, such as shown in FIGS. 6a-h.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit package, comprising:
   a first die area on a substrate, the first die area including a first die;
   a second die area on the substrate and laterally adjacent to the first die area, the second die area including a second die;
   a first channel structure over the first die area and in thermal contact with the first die, the first channel structure having a thermal conductivity, the first channel structure defining one or more channels through which coolant can flow;
   a second channel structure over the second die area and in thermal contact with the second die, the second channel structure having a thermal conductivity different than the thermal conductivity of the first channel structure, the second channel structure defining one or more channels through which coolant can flow; and
   a thermally insulative material separating the first and second channel structures.

2. The integrated circuit package of claim 1, wherein the first and second channel structures include vertical fins extending between top and bottom surfaces, thereby forming the one or more channels.

3. The integrated circuit package of claim 1, wherein at least one of the first and second channel structures includes vertical pillars.

4. The integrated circuit package of claim 3, wherein at least some of the vertical pillars extend from a first surface of the corresponding channel structure and do not reach a second surface opposite the first surface.

5. The integrated circuit package of claim 3, wherein at least some of the vertical pillars extend from a first surface of the corresponding channel structure to a second surface opposite the first surface.

6. The integrated circuit package of claim 1, wherein at least one of the first and second channel structures includes pin fins.

7. The integrated circuit package of claim 1, wherein the coolant flows through the first channel structure in a first direction, and the coolant flows through the second channel structure in a second direction that is opposite the first direction.

8. The integrated circuit package of claim 1, wherein the first and second channel structures comprise copper or silver.

9. An integrated circuit package, comprising:
- a first die area on a substrate, the first die area including a first die;
- a second die area on the substrate and laterally adjacent to the first die area, the second die area including a second die;
- a first metal channel structure over the first die area and in thermal contact with the first die, the first metal channel structure defining one or more channels through which coolant can flow, and the first channel structure having a thermal conductivity;
- a second metal channel structure over the second die area and in thermal contact with the second die, the second metal channel structure defining one or more channels through which coolant can flow, and the second channel structure having a thermal conductivity different than the thermal conductivity of the first channel structure; and
- a frame material around the first and second metal channel structures, the frame material comprising a thermally insulative material, thereby inhibiting heat transfer between the first and second metal channel structures.

10. The integrated circuit package of claim 9, wherein the first and second metal channel structures include vertical fins extending between top and bottom surfaces, thereby forming the one or more channels.

11. The integrated circuit package of claim 9, wherein at least one of the first and second metal channel structures includes vertical pillars.

12. The integrated circuit package of claim 9, wherein at least one of the first and second metal channel structures includes pin fins.

13. The integrated circuit package of claim 9, further comprising:
- a third die area on the substrate and laterally adjacent to the first die area, the third die area including a third die, wherein the first die area is between the second die area and the third die area; and
- a third metal channel structure over the third die area and in thermal contact with the third die, the third metal channel structure defining one or more channels through which coolant can flow.

14. The integrated circuit package of claim 13, wherein the coolant flows through the second and third metal channel structures in a first direction, and the coolant flows through the first metal channel structure in a second direction that is opposite the first direction.

15. The integrated circuit package of claim 13, wherein the second die and the third die are the same die type, and the first die generates more heat than the second and third die.

16. The integrated circuit package of claim 13, wherein the second die and the third die are memory die, and the first die is a processor die.

17. The integrated circuit package of claim 9, wherein the coolant is a cooling fluid, and wherein the first and second metal channel structures comprise copper or silver.

18. An integrated circuit package, comprising:
- a first die area on a substrate, the first die area including a first die;
- a second die area on the substrate and laterally adjacent to the first die area, the second die area including a second die;
- a first channel structure over the first die area and in thermal contact with the first die, the first channel structure defining one or more channels through which coolant can flow;
- a second channel structure over the second die area and in thermal contact with the second die, the second channel structure defining one or more channels through which coolant can flow, wherein the first and second channel structures include vertical fins extending between top and bottom surfaces, thereby forming the one or more channels; and
- a thermally insulative material separating the first and second channel structures.

19. An integrated circuit package, comprising:
- a first die area on a substrate, the first die area including a first die;
- a second die area on the substrate and laterally adjacent to the first die area, the second die area including a second die;
- a first channel structure over the first die area and in thermal contact with the first die, the first channel structure defining one or more channels through which coolant can flow;
- a second channel structure over the second die area and in thermal contact with the second die, the second channel structure defining one or more channels through which coolant can flow, wherein at least one of the first and second channel structures includes pin fins; and
- a thermally insulative material separating the first and second channel structures.

20. An integrated circuit package, comprising:
- a first die area on a substrate, the first die area including a first die;
- a second die area on the substrate and laterally adjacent to the first die area, the second die area including a second die;
- a first channel structure over the first die area and in thermal contact with the first die, the first channel structure defining one or more channels through which coolant can flow;
- a second channel structure over the second die area and in thermal contact with the second die, the second channel structure defining one or more channels through which coolant can flow, wherein the coolant flows through the first channel structure in a first direction, and the coolant flows through the second channel structure in a second direction that is opposite the first direction; and
- a thermally insulative material separating the first and second channel structures.

* * * * *